United States Patent
Suzuki

(10) Patent No.: US 7,498,638 B2
(45) Date of Patent: Mar. 3, 2009

(54) ESD PROTECTION CIRCUIT FOR SEMICONDUCTOR DEVICE

(75) Inventor: Atsuhiro Suzuki, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/775,460

(22) Filed: Jul. 10, 2007

(65) Prior Publication Data
US 2008/0013230 A1    Jan. 17, 2008

(30) Foreign Application Priority Data
Jul. 13, 2006    (JP)    ............................. 2006-192866

(51) Int. Cl.
*H01L 23/62*    (2006.01)
(52) U.S. Cl. ........................ 257/355; 361/56
(58) Field of Classification Search ......... 257/355–358, 257/360, 363; 438/133; 361/56, 111
See application file for complete search history.

(56) References Cited

U.S. PATENT DOCUMENTS 5,847,429 A  * 12/1998 Lien et al. .................. 257/355

6,765,773 B2    7/2004 Reiner
6,956,747 B1    10/2005 Shigyo et al.

FOREIGN PATENT DOCUMENTS

| JP | 9-321226 | 12/1997 |
| JP | 2000-49190 | 2/2000 |
| JP | 2003-124336 | 4/2003 |

* cited by examiner

*Primary Examiner*—David Vu
(74) *Attorney, Agent, or Firm*—Oblon, Spivak, McClelland, Maier & Neustadt, P.C.

(57) ABSTRACT

An ESD protection circuit for a semiconductor device including a bonding pad receiving a first power supply voltage; an interconnect layer provided in an underside of the bonding pad so as to be electrically conductive with the bonding pad; a semiconductor substrate provided with a first well of a predetermined conductive type in a predetermined region of a surface layer of the substrate, which first well receives a second power supply voltage having a different voltage from the first power supply voltage and provided with a confronting region confronting the underside of the interconnect layer over a dielectric layer, and the first well of the semiconductor substrate, the dielectric layer, the bonding pad and the interconnect layer constitute a capacitor.

18 Claims, 4 Drawing Sheets

ESD PROTECTION CIRCUIT FOR SEMICONDUCTOR DEVICE

CROSS-REFERENCE TO RELATED APPLICATIONS

This application is based upon and claims the benefit of priority from the prior Japanese Patent Application No. 2006-192866, filed on, Jul. 13, 2006 the entire contents of which are incorporated herein by reference.

FIELD

The present disclosure is directed to an ESD (Electro Static Discharge) protection circuit for a semiconductor device for providing protection against device destruction caused by electro static discharge.

BACKGROUND

One example of an ESD protection circuit for integrated circuits is disclosed in JP 2003-124336 A. According to the configuration disclosed in JP 2003-124336 A, a passive element formed on the nonconductive layer below the bonding pad establishes connection between the bonding pad and the integrated circuit. Such configuration allows effective use of the chip surface and prevents functional degradation of the integrated circuit when mechanical stress is applied to the bonding pad. Also, a sizable resistive element occupies a large portion of the chip surface in order to impart appropriate ESD protection for CMOS circuit.

However, recent increase in memory capacity and device integration has lead to increase in static electricity charged in the semiconductor chip as compared with the conventional configuration. The technical idea of JP 2003-124336 A is to provide protection from device destruction caused by electro static discharge, thus, a large resistive element composed of electrode interconnect is employed. However, resistive element alone merely provides reduction of electro static charge owning to voltage drop attributable to resistance component (R). In order to improve ESD tolerance, reduction of RC product, the reduction of C component in particular, is required especially in charged device model (CDM). Thus, resistive element merely composed of electrode interconnect is insufficient for achieving such objective.

SUMMARY

The present disclosure provides an ESD (Electro Static Discharge) protection circuit for semiconductor devices allowing improvement in ESD protection tolerance.

An ESD protection circuit for a semiconductor device including a bonding pad receiving a first power supply voltage; an interconnect layer provided in an underside of the bonding pad so as to be electrically conductive with the bonding pad; a semiconductor substrate provided with a first well of a predetermined conductive type in a predetermined region of a surface layer of the substrate, which first well receives a second power supply voltage having a different voltage from the first power supply voltage and provided with a confronting region confronting the underside of the interconnect layer over a dielectric layer, and the first well of the semiconductor substrate, the dielectric layer, the bonding pad and the interconnect layer constitute a capacitor.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One embodiment of the present disclosure will be described with reference to the drawings.

Figure 1A:
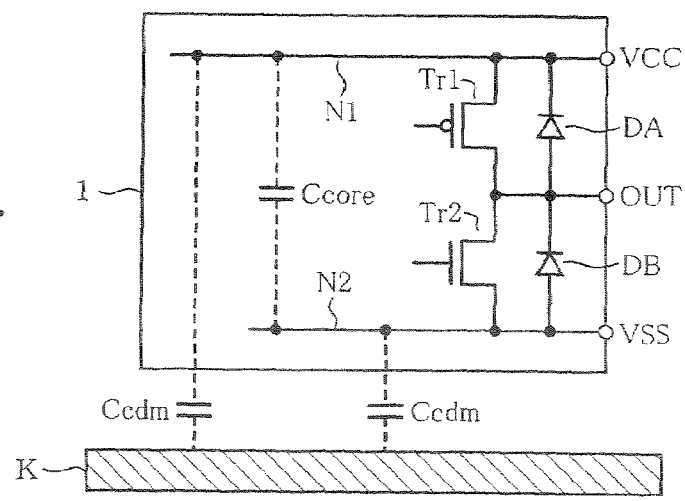
FIGS. 1A to 1C are diagrams describing floating capacitance in accordance with a first embodiment of the present disclosure.
Figure 1B:
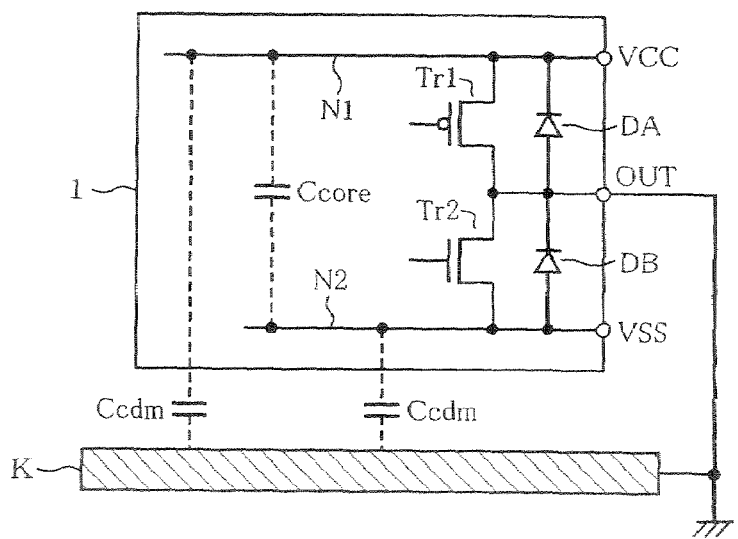
Figure 1C:
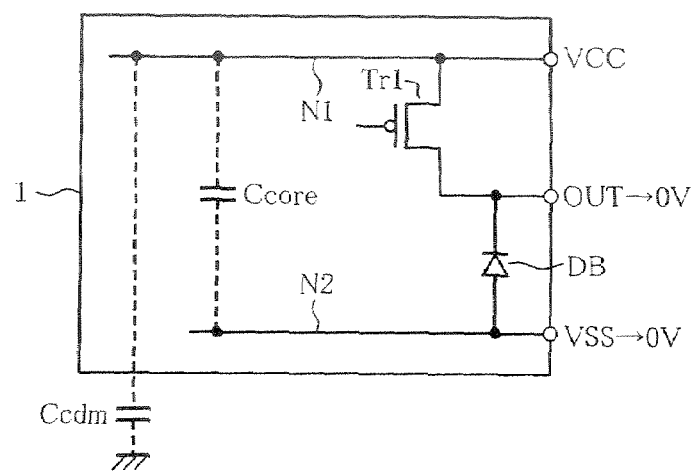

FIGS. 1A to 1C illustrate one example of a CMOS output circuit and depicts CDM (Charged Device Model) test flow which is one type of ESD test (electro static discharge test) for this circuit. In a CDM test, electrical charge is accumulated in a semiconductor chip (semiconductor device) 1 by way of a metal plate (not shown), for example, whereafter discharge current occurring from ground shorting of a terminal is measured.

FIG. 1A indicates an equivalent circuit of the semiconductor chip 1 in charged state. FIG. 1B indicates an equivalent circuit of the state in which an output terminal OUT is shorted after the semiconductor chip 1 is charged. As illustrated in FIG. 1B, when measuring discharge current, a semiconductor package is placed on metal K provided independent of the semiconductor package.

As illustrated in FIG. 1A, a CMOS output circuit 2 includes a PMOS transistor Tr1, and a NMOS transistor Tr2 connected in serial with the PMOS transistor Tr1. A node receiving high voltage Vcc is identified as node N1 and a node receiving low voltage Vss is identified as node N2. The transistors Tr1 and Tr2 are connected in serial between nodes N1 and N2. A diode DA is connected to the output side of the transistor Tr1 so as be connected in a forward direction from the output terminal OUT to the node N1 side, whereas a diode DB is connected to the output side of the transistor Tr2 so as be connected in a forward direction from the node N2 to the output terminal OUT side. The diodes DA and DB constitute the protection circuit of the Transistors Tr1 and Tr2.

FIG. 1A also illustrates floating capacitance component occurring in the semiconductor chip 1. Capacitance Ccdm indicates capacitance between the external metal K and nodes N1 and N2 and the capacitance relying on the total area of the semiconductor chip 1 and package area. Also, capacitance Score indicates capacitance between nodes N1 and N2. Charge and discharge occurring when applying positive or negative high voltage (+1000V or −1000V, for example) is applied to the semiconductor chip 1 will be observed hereinafter.

In case the semiconductor chip 1 is charged by positive high-voltage, voltages of nodes N1 and N2 respectively are increased to high-voltage V1 (+1000 V, for example). Then, as shown in FIG. 1B, when output terminal OUT is ground shorted, forward bias is applied to the diode DB, thereby rendering the diode DB conductive in the forward direction and diffusion diode of the transistor Tr2 operates in the forward direction.

Thus, the voltage of the node N2 is reduced to substantially 0V from voltage V1. On the other hand, reverse bias is applied to the diode DA. The voltage of node N1 is determined based on synthesized capacitance of Ccdm between node N1 and metal K and Ccore between nodes N1 and N2, and can be obtained by the following equation (1) according to charge conservation law (Vn1 represents voltage of node N1).

$$Vn1 = V1 \times Ccdm/(Ccdm+Ccore) \quad (1)$$

Capacitance Ccdm is a capacitance relying on the area of the semiconductor chip 1 and the package as described earlier and is generally in the range of several pF to tens of pF, normally averaging at 2 pF, for example.

FIG. 1C illustrates an equivalent circuit depicting the above described state. As illustrated in FIG. 1C, voltage applied to node N1 is applied between the source/drain of PMOS transistor Tr1. The voltage applied to node N1 imposes stress on the transistor Tr1 which is the most critical factor leading to failures in transistor Tr1.

In case the semiconductor chip 1 is charged by negative high-voltage, the voltage between nodes N1 and N2 amounts to voltage V1 (−1000V, for example). Then, as shown in FIG. 1B, when output terminal OUT is ground shorted, forward bias is applied to the diode DA, thereby placing the voltage of node N1 at 0V. On the other hand, since reverse bias is applied to the diode DB, the voltage of node N2 can be obtained by the following equation (2). (Vn2 represents voltage of node N2)

$$Vn2 = -V1 \times Ccdm/(Ccdm+Ccore) \quad (2)$$

As described earlier, voltage Vn2 applied to the node N2 imposes stress on the transistor Tr2 leading to device destruction.

It has been found that reduction of absolute value of voltage Vn1 and voltage Vn2 consequently prevents ESD destruction. The critical factor in further reducing the absolute value of voltage Vn1 and voltage Vn2 is the increase in capacitance Ccore between node N1 and node N2 as can be seen in equations (1) and (2).

Figure 2:
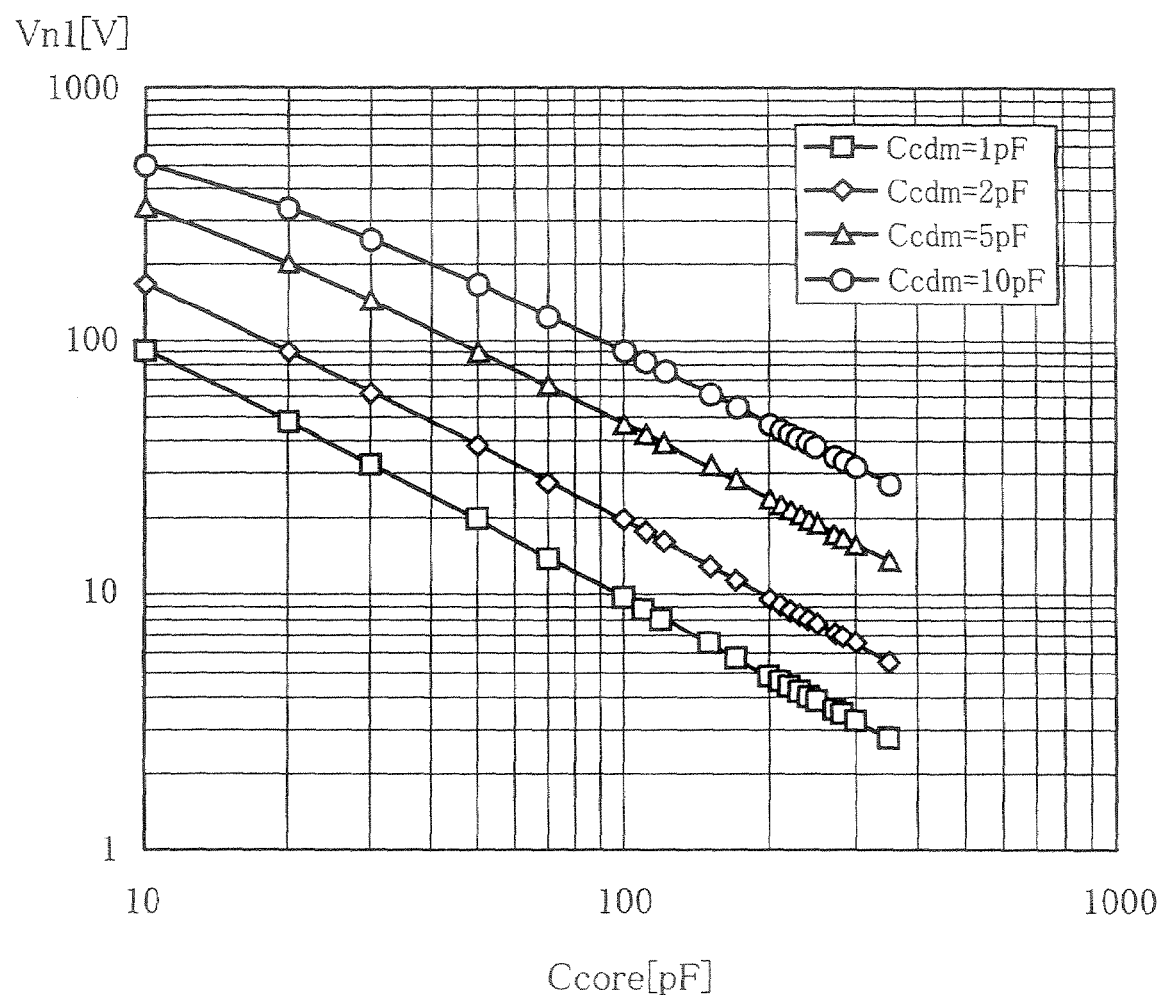
FIG. 2 is a chart indicating a logical value of voltage versus capacitance.

FIG. 2 indicates logical values of Ccore capacitance versus voltage Vn1 calculated based on equations (1) and (2) when voltage V1 is applied. Variation in voltage Vn1 corresponding to the variation in capacitance Ccore when capacitance Ccdm takes 1 pF, 2 pF, 5 pF and 10 pF respectively is illustrated in the chart of FIG. 2.

As can be seen in FIG. 2, since increase in capacitance Ccore reduces the voltage Vn1, stress imposed on the semiconductor chip 1 can be reduced. In order to set the voltage Vn1 at approximately 10V, capacitance Ccore needs to be set in the order of several hundred pF.

Index voltage of Vn1=10V is sufficiently tolerable to reverse bias of transistor Tr1, transistor Tr2 and diffusion diode connected to the output terminal OUT. Since a transistor capable of outputting high voltage from the output terminal OUT is used when employing a high-voltage input output circuit, capacitance Ccore needs to be increased in order to secure Vcdm tolerable to such voltage. Generally, area is increased to increase the capacitance Ccore; however, this leads to increase in chip size.

For example, in case MOS capacitor is employed with a gate oxide film having a thickness of 80 Å (Angstrom), approximately 4.32 fF/$\mu m^2$ (f indicates femto=$10^{-15}$) of capacitance can be obtained per unit area; however, in case voltage Vn1 or voltage Vn2 is 10V, approximately 20000 $\mu m$ or greater area is required in order to set a capacitance of 100 pF or greater.

To give another example, in case capacitance between a plurality of metal interconnect layers provided inside the semiconductor chip 1 is employed as a capacitor, required area is further increased compared to the above described example since approximately $10^{-17}$ F/$\mu m^2$ of capacitance is obtained per unit area. Thus, the attempt to improve capacitance by metal interconnect by considering the configuration disclosed in JP 2003-124336 A as a capacitor merely provides capacitance between metal interconnects in the order of few [fF] per 1 [$\mu m^2$] which does not qualify for practical use.

Figure 3A:
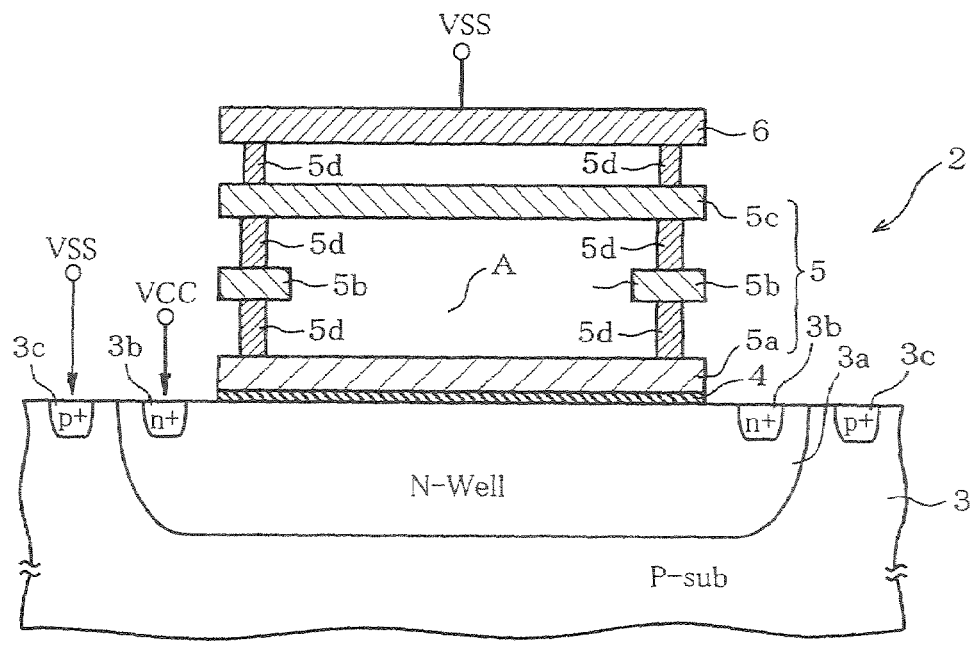
FIG. 3A is a cross sectional view illustrating a periphery of a connecting region of a bonding pad.
Figure 3B:
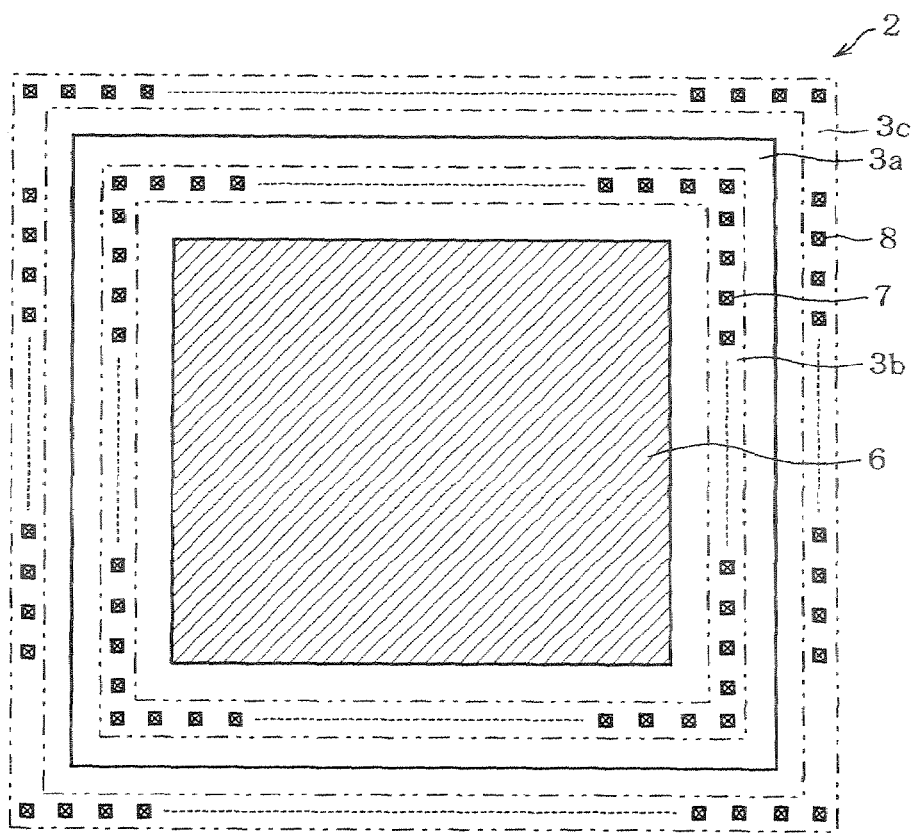
FIG. 3B is a plan view illustrating the periphery of the connecting region of the bonding pad.

FIG. 3A schematically illustrates a cross sectional structure of a semiconductor device for configuring an ESD protection circuit. More specifically, FIG. 3A schematically illustrates cross sectional structure in the proximity of the connection region of the bonding pad that receives power source voltage VSS. FIG. 3B is a schematic plan view of FIG. 3A.

ESD protection circuit 2 includes a silicon substrate 3 serving as a semiconductor substrate, a multilayer interconnect structure 5 overlying the silicon substrate 3 so as to confront the silicon substrate 3 over a dielectric layer 4, the multilayer interconnect structure 5 being composed of multiple layers (three, for example), and a bonding pad 6 configured in a square shape in plan view on the multilayer interconnect 5.

The ESD protection circuit 2 is configured to utilize the region below the connection region of the bonding pad 6 and forms capacitance Ccore by employing the so called MOS capacitor structure.

The structure of the semiconductor device will be described in detail hereinafter. Referring to FIG. 3A, an N-well 3a constituting a lightly-doped n-type impurity introducing region (n−) is formed on the surface layer of the p-type silicon substrate 3. A heavily-doped n-type impurity introducing region (n+) constituting a contact region 3b is formed on the surface layer side of the N-well 3a.

Referring to FIG. 3B, a plurality of contact plugs 7 are provided on the contact region 3b and around the bonding pad 6 and the interconnect layers 5a to 5c in plan view. Multiple contact plugs 7 are provided around the bonding pad 6 (ten for example for each side of the bonding pad 6) at consistent intervals to prevent latch-up effects, and high-voltage power source voltage VCC (corresponds to a second power supply voltage) is applied to the contact plugs 7.

Also, as illustrated in FIG. 3A, a contact region 3c constituting a heavily-doped p-type impurity introducing region (p+) is provided around the N-well 3a in the surface layer of the silicon substrate 3. As illustrated in FIG. 3B, a plurality of contact plugs 8 is provided around the N-well 3a in plan view. The contact plugs 8 likewise are provided at consistent intervals, and low-voltage power supply VSS (corresponding to a first power supply voltage) is applied to the contact plugs 8.

The dielectric layer 4 is formed on the N-well 3a. The dielectric layer 4 is provided to maintain dielectric characteristics between the multilayer interconnect structure 5 and the N-well 3a. The multilayer interconnect structure 5 is provided with interconnect layers 5a, 5b, and 5c listed in sequence from the lowermost layer, and via plugs 5d electrically connecting the interconnect layers 5a to 5c with the bonding pad 6.

The interconnect layers 5a to 5c are each formed by polycrystalline silicon doped with impurities and constitute a MOS capacitor electrode. Of note is that either both or at least one of the interconnect layers 5b and 5c provided below the substantial central portion of the bonding pad 6 are/is removed.

An interlayer insulating film (not shown) is filled in the region A where the interconnect layer(s) is/are removed. The interlayer insulating film is composed of a TEOS (Tetra Ethoxy Silane) film, more specifically, a TEOS film formed by high-density plasma CVD, for example, and functions to provide insulation from other electrical structures as well as reducing mechanical stress.

Thus, as illustrated in FIG. 3A and 3B, the planar area of the interconnect layers 5a and 5c is greater than the planar area of the intermediary interconnect layer 5b. This reduces mechanical damage imposed by bonding stress suffered by the underlying structures of the bonding pad 6. Though not shown, the interlayer insulating film is formed between the interconnect layers 5a to 5c and also between the via plugs 5d above the silicon substrate 3 surface layer.

The bonding pad 6 having one side configured at 80 [$\mu$m], for example, would provide a surface area of 80 [$\mu$m]×80 [$\mu$m]=6400 [$\mu m^2$]. However, if voltage VCC and VSS are taken as a single pair, capacitance can be provided by confronting electrodes in a surface area amounting to 12800 [$\mu m^2$].

At this instance, if a silicon oxide film of 80 [Å], for example, is employed as a dielectric layer 4, a capacitance of approximately 64 [pF] can be obtained between nodes N1 and N2 receiving power supply voltage VCC/VSS. An ordinary semiconductor chip has more than one bonding pad 6 receiving power supply voltage VCC/VSS, thus further increase in capacitance can be achieved, thereby increasing ESD protection tolerance compared to conventional configurations.

According to the present embodiment, the N-well 3a, the dielectric layer 4, the bonding pad 6, and the multilayer interconnect structure 5 constitute a MOS capacitor, thus providing increased ESD protection tolerance compared to conventional configurations.

The contact region 3b of the N-well 3a is provided in the outer periphery of a confronting region where the silicon substrate 3 and the interconnect layer 5a confront each other, thus connecting region of the contact plug 7 can be readily secured without increasing the chip size.

Since a plurality of contact plugs 7 are provided at consistent intervals from one another along the outer periphery of the confronting region, local current discharge can be restrained to prevent latch-up effect.

A region A is provided in which at least either of the interconnect layers 5b and 5c of the multilayer interconnect structure 5 below the substantial central portion of the bonding pad 6 has been removed. By filing the interlayer insulating film in region A, damage suffered by the underlying structure by bonding stress can be reduced.

It is not desirable, for example, to configure the N-well 3a as heavily-doped impurity introducing region, since it would intensify the volatility in capacitance. In the present embodiment, capacitance can be kept at a consistent level to the possible extent since the N-well 3a is formed in light dope as compared to the dope of the contact region 3b.

Figure 4A:
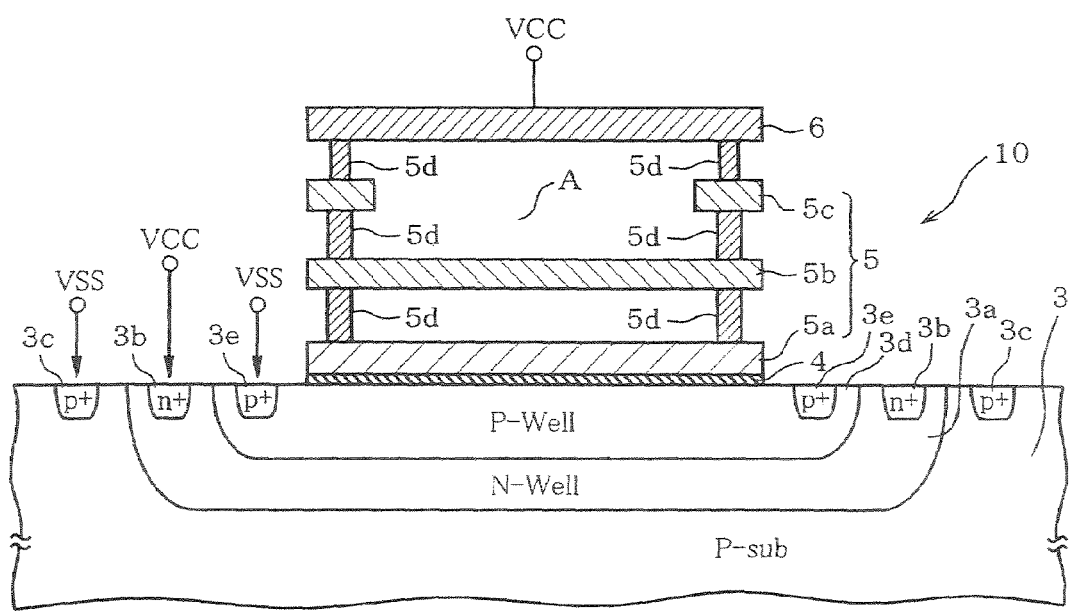
FIG. 4A corresponds to FIG. 3A and illustrates a second embodiment of the present disclosure.
Figure 4B:
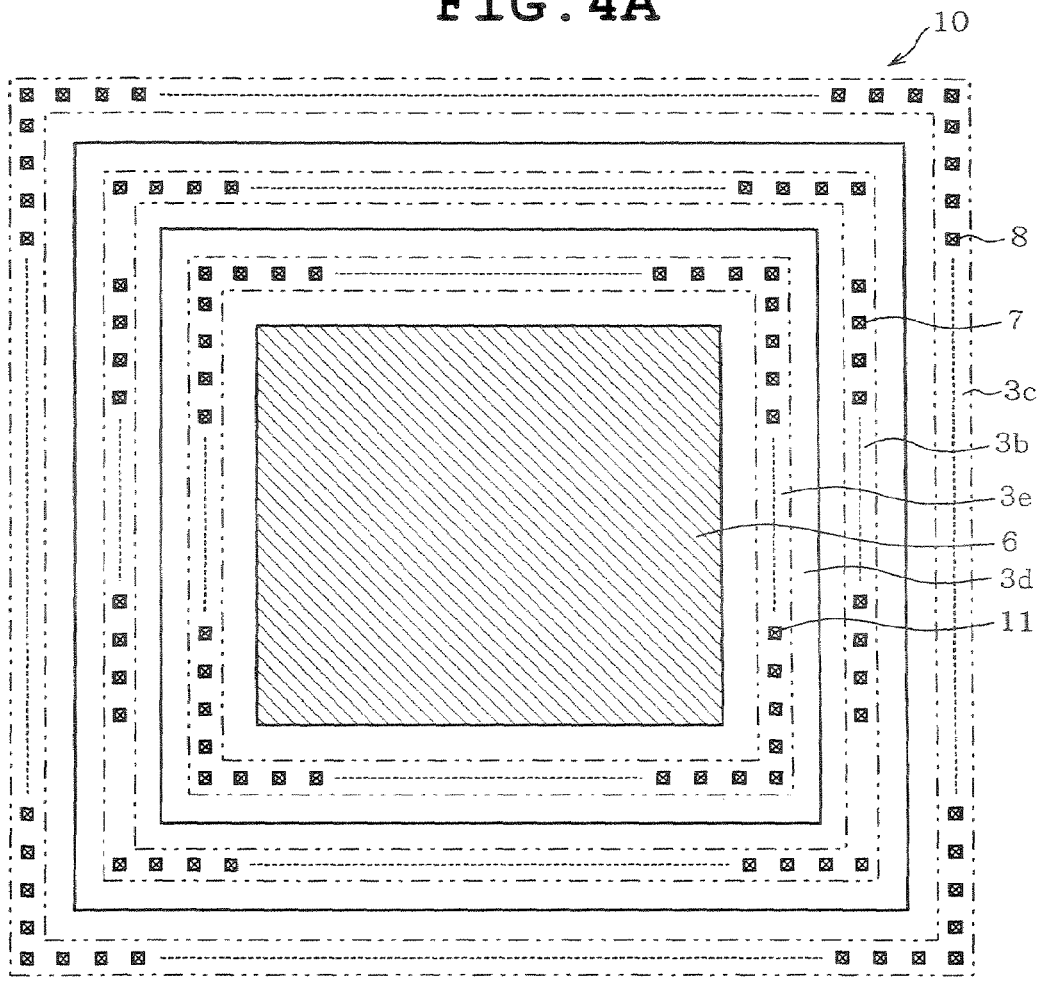
FIG. 4B corresponds to FIG. 3B and illustrates the second embodiment of the present disclosure.

FIGS. 4A and 4B illustrate a second embodiment in accordance with the present disclosure which differs from the first embodiment in the well structure of the silicon substrate 3. The portions that are identical with the first embodiment will be indicated by the same reference symbols and will not be explained. Hereinafter, description will be given on the portions that differ from the first embodiment.

FIG. 4A schematically illustrates a cross sectional structure in the proximity of the connection region of the bonding pad of an ESD protection circuit 10 which is a variation of the ESD protection circuit 2 of the first embodiment. FIG. 4B schematically illustrates the planar structure in the proximity of the connection region of the bonding pad.

In the first embodiment, the N-well 3a is formed in the surface layer of the silicon substrate 3; however, in the present embodiment, a P-well 3d is further configured in the surface layer within the N-well 3a. The multilayer interconnect structure 5 is formed so as to face the P-well 3d over the dielectric layer 4. As was the case in the first embodiment, capacitance can be maintained at a consistent level to the possible extent, since the P-well 3d is lightly doped.

Contact region 3e is provided in the surface layer of the silicon substrate 3, more specifically, in the outer periphery of the region where the P-well 3d and the multilayer interconnect structure 5 confront each other. The contact region 5e is configured by heavily-doped p-type impurity introducing region. A plurality of contact plugs 11 are provided at consistent intervals from one another in the contact region 3e to prevent latch-up effects as in the first embodiment. Power supply voltage VSS is applied externally of the contact plugs 11. Also, power supply voltage VCC is applied to the bonding pad 6.

According to the present embodiment, since the N-well 3a is formed in a predetermined region of the surface layer of the silicon substrate 3 so as to surround the p-well 3d, diffusion capacitance of the depleted layer of the PN junction between the p-type silicon substrate 3 and the N-well 3a, and diffusion capacitance of the depleted layer of the PN junction between the P-well 3d and the N-well 3a contribute to improvement in capacitance, thus allowing further increase in capacitance as compared to conventional configuration or the first embodiment.

The present disclosure is not limited to the above embodiment but may be modified or expanded as follows.

The present disclosure is not limited to application to multilayer interconnect structure 5 but maybe applied to a single layer interconnect layer. The semiconductor substrate is not limited to a silicon substrate 3.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. An ESD protection circuit for a semiconductor device, comprising:
   a bonding pad receiving a first power supply voltage;
   an interconnect layer provided in an underside of the bonding pad so as to be electrically conductive with the bonding pad;
   a semiconductor substrate provided with a first well of a predetermined conductive type in a predetermined region of a surface layer of the substrate, which first well receives a second power supply voltage having a different voltage from the first power supply voltage and provided with a confronting region confronting the underside of the interconnect layer over a dielectric layer, and
   the first well of the semiconductor substrate, the dielectric layer, the bonding pad and the interconnect layer constitute a capacitor.

2. The circuit of claim 1, wherein the first well of the semiconductor substrate is provided with a contact region in the surface layer of the semiconductor substrate and the contact region of the first well is provided in an outer periphery of the confronting region where the interconnect layer and the semiconductor substrate confront each other.

3. The circuit of claim 2, wherein a plurality of contact plugs is provided on the contact region of the first well at consistent intervals along the outer periphery of the confronting region.

4. The circuit of claim 2, wherein the semiconductor substrate is provided with a second well having an opposite conductive type from the first well in a predetermined region of the surface layer surrounding the first well, the second well receiving the first power supply voltage.

5. The circuit of claim 4, wherein the second well of the semiconductor substrate is provided with a contact region for receiving a first power supply voltage on a surface thereof and the second well contact region is provided in the outer periphery of the first well.

6. The circuit of claim 5, wherein a plurality of contact plugs is provided on the contact region of the second well at consistent intervals along the outer periphery of the confronting region.

7. The circuit of claim 3, wherein the interconnect layer is constituted by a multilayer interconnect structure composed of a plurality of layers, the multilayer interconnect structure provided with a region in which at least one of the plurality of layers below a substantial central portion of the bonding pad is removed, the region having an interlayer insulating film formed therein.

8. The circuit of claim 3, wherein the first well of the semiconductor substrate is an N-well having light-dope of impurities introduced therein.

9. The circuit of claim 2, wherein the semiconductor substrate is provided with a second well having an opposite conductive type from the first well in a predetermined region of the surface layer surrounding the first well, the second well receiving the first power supply voltage.

10. The circuit of claim 9, wherein the second well of the semiconductor substrate is provided with a contact region for receiving the first power supply voltage on a surface thereof and the second well contact region is provided in the outer periphery of the first well.

11. The circuit of claim 10, wherein a plurality of contact plugs is provided on the contact region of the second well at consistent intervals along the outer periphery of the confronting region.

12. The circuit of claim 2, wherein the interconnect layer is constituted by a multilayer interconnect structure composed of a plurality of layers, the multilayer interconnect structure provided with a region in which at least one of the plurality of layers below a substantial central portion of the bonding pad is removed, the region having an interlayer insulating film formed therein.

13. The circuit of claim 2, wherein the first well of the semiconductor substrate is an N-well having light-dope of impurities introduced therein.

14. The circuit of claim 1, wherein the semiconductor substrate is provided with a second well having an opposite conductive type from the first well in a predetermined region of the surface layer surrounding the first well, the second well receiving the first power supply voltage.

15. The circuit of claim 14, wherein the second well of the semiconductor substrate is provided with a contact region for receiving the first power supply voltage on a surface thereof and the second well contact region is provided in the outer periphery of the first well.

16. The circuit of claim 15, wherein a plurality of contact plugs is provided on the contact region of the second well at consistent intervals along the outer periphery of the confronting region.

17. The circuit of claim 1, wherein the interconnect layer is constituted by a multilayer interconnect structure composed of a plurality of layers, the multilayer interconnect structure provided with a region in which at least one of the plurality of layers below a substantial central portion of the bonding pad is removed, the region having an interlayer insulating film formed therein.

18. The circuit of claim 1, wherein the first well of the semiconductor substrate is an N-well having light-dope of impurities introduced therein.

* * * * *